United States Patent [19]

Ohoka

[11] Patent Number: 5,534,726
[45] Date of Patent: Jul. 9, 1996

[54] SEMICONDUCTOR DEVICE PROVIDED WITH STATUS DETECTING FUNCTION

[75] Inventor: Tsukasa Ohoka, Tokyo, Japan

[73] Assignee: NEC Corporation, Tokyo, Japan

[21] Appl. No.: 296,088

[22] Filed: Aug. 25, 1994

Related U.S. Application Data

[63] Continuation of Ser. No. 68,383, May 28, 1993, abandoned.

[30] Foreign Application Priority Data

Jun. 2, 1992 [JP] Japan ..................... 4-141280

[51] Int. Cl.⁶ .................................. H01L 23/58
[52] U.S. Cl. ................... 257/489; 257/459; 257/488
[58] Field of Search .................... 257/379, 448, 257/459, 488, 489, 630, 48, 170

[56] References Cited

U.S. PATENT DOCUMENTS

| | | | |
|---|---|---|---|
| 4,157,563 | 6/1979 | Bosselaar | 257/489 |
| 4,931,844 | 6/1990 | Zommer | 257/48 |
| 4,962,411 | 10/1990 | Tokura et al. | 257/48 |
| 5,034,797 | 7/1991 | Yamanaka et al. | 257/380 |
| 5,081,510 | 1/1992 | Ohtsuka et al. | 257/483 |

FOREIGN PATENT DOCUMENTS 56-74961  6/1981  Japan ..................... 257/48

*Primary Examiner*—Sara W. Crane
*Assistant Examiner*—T. M. Arroyo

[57] ABSTRACT

A semiconductor device where an aluminum electrode surrounds an output electrode of an element, is provide by a detector electrode formed on a ring shaped space between the output electrode and the aluminum electrode. Sliding of the aluminum electrode toward the output electrode which occurs in an aging degradation, is detected by contact between the aluminum electrode and the detector electrode.

5 Claims, 2 Drawing Sheets

FIG. 1A
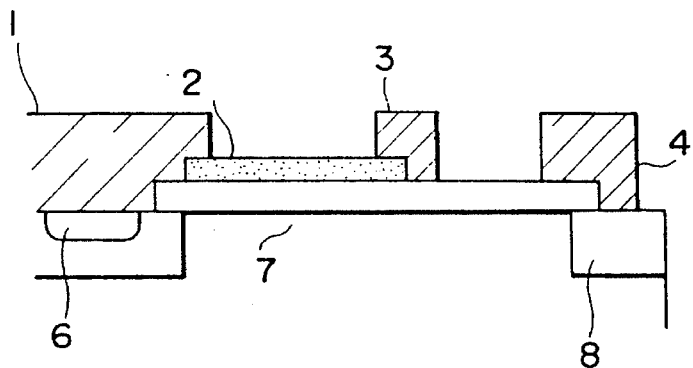
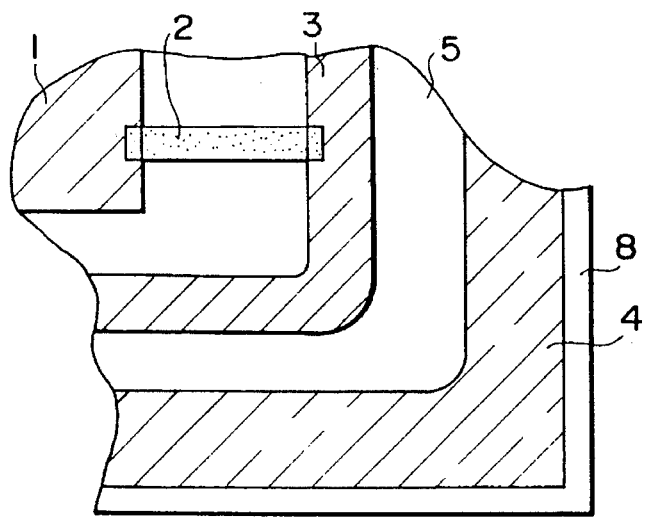
FIG. 1B
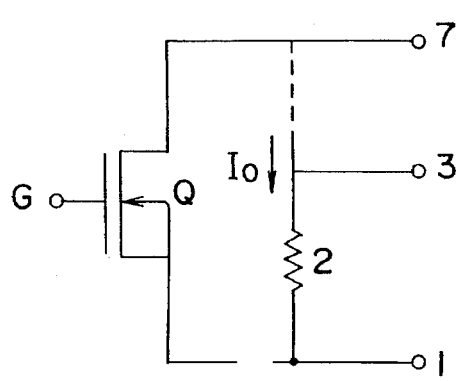
FIG. 1C
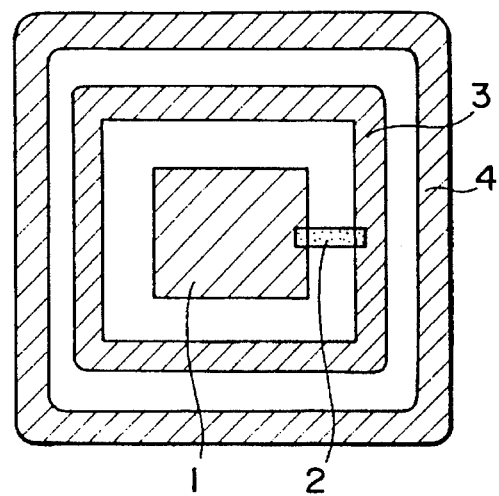
FIG. 1D

SEMICONDUCTOR DEVICE PROVIDED WITH STATUS DETECTING FUNCTION

This is a continuation of application Ser. No. 08/068,383, filed May 28, 1993 abandoned.

BACKGROUND OF THE INVENTION

This invention relates to a semiconductor device, and more particularly to a semiconductor device provided with status detecting function.

For example, in a vertical channel type FET(field effect transistor), detection of drain current or detection of chip temperature is known as a means for detecting abnormal status. Thus, an abnormality of electric characteristic or temperature rise in an ON state of a semiconductor device is detected to protect against property degradation or damage of the device.

But, in heretofore known semiconductor devices, there are no built-in detector for detecting abnormalities in an OFF state of a semiconductor device. Aluminum lead wires, for example, are liable to be slid on a substrate from heat cycles repeated in ages, and are short circuited with other lead wires. In heretofore known semiconductor devices, such a short circuit can not be predicted.

In a MOSFET, an output electrode is placed in the central part of the MOSFET, and a channel stopper is formed around the boundary of the MOSFET. An aluminum electrode connected to the channel stopper is supplied by a power supply voltage in order to bias the channel stopper layer at a proper voltage level. This aluminum electrode is apt to be slid toward the center and the power supply voltage is impressed to the output electrode.

BRIEF DESCRIPTION OF THE INVENTION

Therefore, a primary object of the present invention is to provide a built-in detector for detecting aging degradations. More particularly, an object of this invention is to predict the sliding of the aluminum electrode before the electrode touches to the output electrode.

For this object, a detector electrode is provided in a ring shaped space between the output electrode and the surrounding electrode of the channel stopper. The detector electrode is connected through a high resistance to the output electrode. In a normal OFF state, no current flows in the high resistance connected between the detector electrode and the output electrode, and the voltage at the detector electrode is same with that at the output electrode. When the aluminum electrode of the channel stopper is slid toward the center, the aluminum electrode touches the detector electrode, and the voltage of the detector electrode rises to the power supply voltage. Thus, the voltage at the detector electrode predicts the sliding of the aluminum electrode and prevents the short circuit between the power supply electrode and the output electrode.

BRIEF DESCRIPTION OF THE DRAWINGS

Further objects, features, and advantages of this invention will become apparent from consideration of the following description of the appended claims, and the accompanying drawings in which the same numerals indicate the same or the corresponding parts.

FIGS. 1(a) to 1(d) show an embodiment of the present invention.

DETAILED DESCRIPTION OF THE PREFERRED EMBODIMENTS

Figure 2:
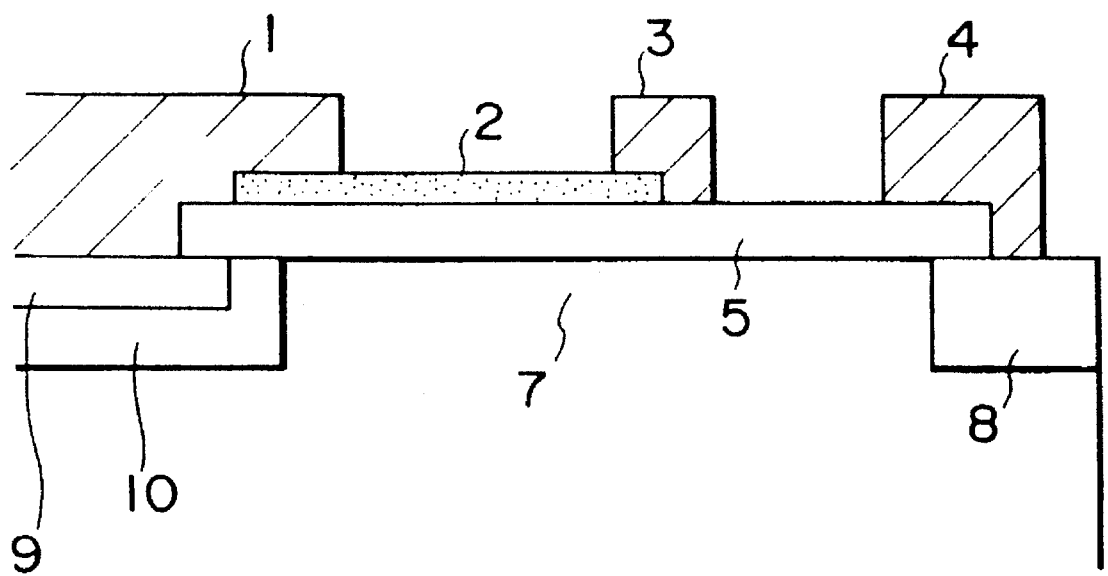
FIG. 2 shows another embodiment of this invention.

Referring to FIGS. 1(a) and 1(b), where FIG. 1(a) shows a crosssectional view and FIG. 1(b) shows a plan view, on a Si substrate 7, an oxide film 5 for insulation is formed. A source diffused layer 6 and a channel stopper diffused layer 8 are formed in the substrate 7. An output electrode 1 is formed on the source diffused layer 6, and a channel stopper electrode 4 is formed on the channel stopper diffused layer 8.

According to this invention, a detector electrode 3 is formed on the oxide film 5 on a ring shaped space between the output electrode 1 and the stopper electrode 4. A resistor 2 of a high resistance connects the detector electrode 3 to the output electrode 1.

FIG. 1(c) illustrates an equivalent circuit of the device shown by FIGS. 1(a) and 1(b). The substrate 7 makes a drain of this FET Q, and since the channel stopper diffused layer 8 and the substrate 7 are in a same conductivity type, the voltage at the channel stopper electrode 4 makes the drain voltage of the substrate 7. And the drain voltage is the power supply voltage. The gate electrode G is not shown in FIG. 1(a) and FIG. 1(b).

In an OFF state of the FET Q, when the transistor Q is working normally without any aging degradations, voltage of the detector electrode 3 is the same with that of the output electrode, since no current is flowing through the resistor 2.

The channel stopper electrode 4 is placed at a same potential with that of the substrate 7, that is at a drain potential, through the channel stopper diffused layer 8.

In an aging degradation where heat cycles are repeated, the channel stopper electrode 4 which is made of a wire shaped aluminum and is placed around the periphery of an element is apt to be slid on the oxide film 5 toward the center of the element. In this sliding of the channel stopper electrode 4, the electrode 4 contacts the detector electrode 3. This contact is detected by a voltage change of the detector electrode 3, even in an OFF state of the transistor Q. By this contact, a small current flows in the resistor 2, but it does no harm either to the transistor Q or to the power supply circuit.

Thus, this voltage change at the detector electrode 3 is taken as a warning of an aging degradation of the element, and effective measures for preventing a serious deterioration or an element damage are carried out.

FIG. 1(d) shows a plan view of an embodiment of this invention, where the output electrode 1 is surrounded by the stopper electrode 4 and the detector electrode 3 is placed between the output electrode 1 and the stopper electrode 4.

Heretofore, this invention is described in connection with an FET. But it is apparent that this invention is applicable on other types of semiconductors. FIG. 2 shows a crosssectional view of another embodiment of this invention, and there is an emitter diffused layer 9 of a bipolar transistor connected to the output electrode 1. Under the emitter diffused layer 9, there is a base diffused layer 10. A detector electrode 3 is formed on a ring shaped space between the aluminum electrode 4 and the output electrode 1. The sliding of the aluminum electrode 4 is detected by a voltage change of the detector electrode.

What is claimed is:

1. A semiconductor device comprising:
    a substrate; a semiconductor element formed in said substrate; an output electrode formed on said semiconductor element; a detector electrode; an aluminum electrode formed on said substrate and being spaced from and surrounding said detector electrode; an oxide film formed on said semiconductor substrate between said output electrode and said aluminum electrode; said detector electrode being formed on said oxide film such that said detector electrode is separated from and surrounds said output electrode; and a resistor connected only between said detector electrode and said output electrode.

2. A semiconductor device of claim 1, wherein said detector electrode overlaps and covers one end of said resistor and said output electrode overlaps and covers another end of said resistor.

3. A semiconductor device according to claim 1, wherein said aluminum electrode is connected to a channel stopper diffused layer surrounding said aluminum electrode.

4. A semiconductor device according to claim 3, wherein said aluminum electrode is supplied with a power supply voltage.

5. A semiconductor device according to claim 1, wherein voltage on said detector electrode is monitored for a warning of an aging degradation of the semiconductor element.

* * * * *